(12) United States Patent
Fang et al.

(10) Patent No.: US 9,991,204 B2
(45) Date of Patent: Jun. 5, 2018

(54) THROUGH VIA STRUCTURE FOR STEP COVERAGE IMPROVEMENT

(71) Applicant: TAIWAN SEMICONDUCTOR MANUFACTURING CO., LTD., Hsinchu (TW)

(72) Inventors: Li-Yen Fang, Tainan (TW); Jung-Chih Tsao, Tainan (TW); Yao-Hsiang Liang, Hsinchu (TW); Yu-Ku Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/628,902

(22) Filed: Jun. 21, 2017

(65) Prior Publication Data

US 2017/0287841 A1 Oct. 5, 2017

Related U.S. Application Data

(62) Division of application No. 14/839,934, filed on Aug. 29, 2015, now Pat. No. 9,711,454.

(51) Int. Cl.
| | |
|---|---|
| *H01L 23/48* | (2006.01) |
| *H01L 23/532* | (2006.01) |
| *H01L 23/535* | (2006.01) |
| *H01L 21/768* | (2006.01) |
| *H01L 23/528* | (2006.01) |

(52) U.S. Cl.
CPC .. *H01L 23/53238* (2013.01); *H01L 21/76804* (2013.01); *H01L 21/76846* (2013.01); *H01L 21/76877* (2013.01); *H01L 23/528* (2013.01); *H01L 23/535* (2013.01); *H01L 23/5329* (2013.01)

(58) Field of Classification Search
None
See application file for complete search history.

(56) References Cited

U.S. PATENT DOCUMENTS

| | | |
|---|---|---|
| 6,420,784 B2 | 7/2002 | Hu et al. |
| 6,841,477 B1 * | 1/2005 | Uchibori ............. H01L 21/7681 257/211 |
| 2002/0137332 A1 | 9/2002 | Paranjpe et al. |
| 2007/0085209 A1 | 4/2007 | Lu et al. |
| 2009/0315144 A1 | 12/2009 | Wang |
| 2010/0200991 A1 | 8/2010 | Akolkar et al. |
| 2012/0161320 A1 | 6/2012 | Akolkar et al. |
| 2013/0277842 A1 | 10/2013 | Baumann et al. |

* cited by examiner

*Primary Examiner* — Whitney T Moore
*Assistant Examiner* — Herve Assouman
(74) *Attorney, Agent, or Firm* — Maschoff Brennan

(57) ABSTRACT

A semiconductor device includes a substrate, a dielectric structure, a barrier layer, a glue layer, a copper seed layer and a copper layer. The dielectric structure is disposed over the substrate. The dielectric structure has a through via hole passing through the dielectric structure, and a sidewall of the through via hole includes at least one indentation. The barrier layer conformally covers the sidewall and a bottom of the through via hole. The glue layer conformally covers the barrier layer. The copper seed layer conformally covers the glue layer. The copper layer covers the copper seed layer and fills the through via hole.

20 Claims, 15 Drawing Sheets

THROUGH VIA STRUCTURE FOR STEP COVERAGE IMPROVEMENT

PRIORITY CLAIM AND CROSS-REFERENCE

This is a divisional application of U.S. patent application Ser. No. 14/839,934 filed on Aug. 29, 2015, which is incorporated herein by reference in its entirety.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices. In the three-dimensional (3D) device, various interlayer connecting structures, such as contacts and through vias, are used to connect transistors and other devices. Currently, because copper offers lower resistivity than aluminum, and using a lower resistivity connecting material can decrease RC delay of the interlayer connecting structures, and thus increasing the device speed, copper has been used as a material for fabricating the interlayer connecting structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
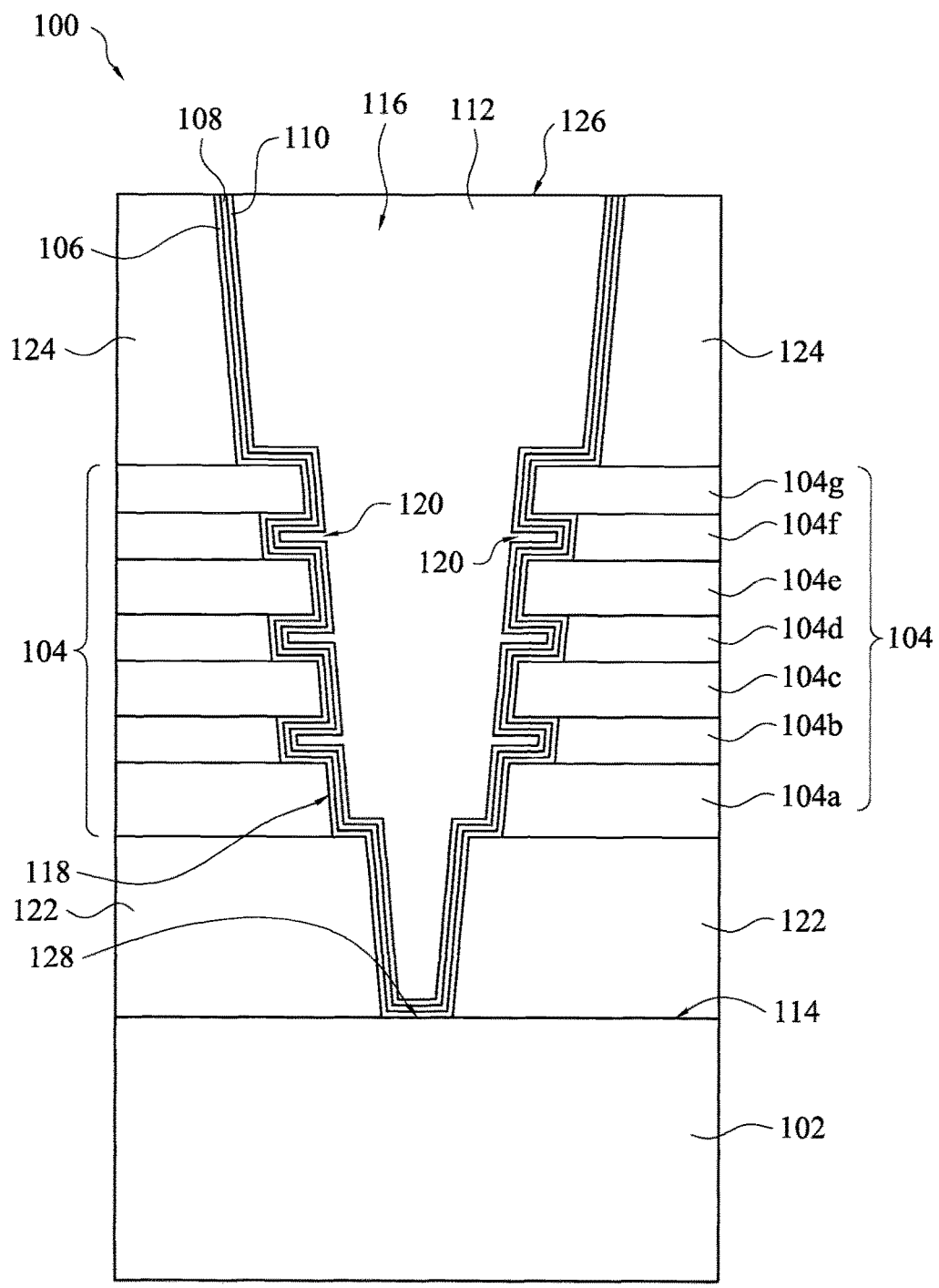
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing a through via, a through via hole is formed to pass through various dielectric layers, a copper seed layer is formed to cover the through via hole, and then a copper layer is formed based on the copper seed layer to fill the through via hole, so as to complete the formation of the through via. The through via hole passing through the dielectric layers has a high aspect ratio, such that it is difficult to deposit a uniform and continuous copper seed layer. Thicker portions of the copper seed layer have lower resistivity than thinner portions of the copper seed layer, such that copper plating rates of the copper layer on the thicker portion of the copper seed layer are greater those on the thinner portions of the copper seed layer, and thus inducing voids formed in the copper layer. When the through via hole passes through the dielectric layers having different etching rates, the through via hole has an uneven sidewall due to different etching rates of the dielectric layers, and resulting in worse step coverage of the copper seed layer. In order to improve the unevenness of the sidewall of the through via hole, several metal rings are formed in some the dielectric layers to block etching of the dielectric layers including the metal rings. However, as the through vias are increasingly shrunk, the formation of the metal rings with smaller sizes is getting more and more difficult, and thus inducing a bridge concern between the through vias.

Embodiments of the present disclosure are directed to providing a semiconductor device and a method for manufacturing the semiconductor device, in which a glue layer is formed between an operation of forming a barrier layer and an operation of forming a copper seed layer. The copper seed layer has superior adhesion to the glue layer, such that a self-agglomeration of copper of the copper seed layer is effectively prevented when the copper seed layer is formed on the glue layer, and step coverage of the copper seed layer is significantly enhanced, thereby obtaining a uniform and continuous copper seed layer. Consequently, a copper layer which is grown based on the copper seed layer and fills a through via hole is formed uniformly, and a through via without void is achieved.

FIG. 1 is a schematic cross-sectional view of a semiconductor device in accordance with various embodiments. In some embodiments, as shown in FIG. 1, the semiconductor device 100 includes a substrate 102, a dielectric structure 104, a barrier layer 106, a glue layer 108, a copper seed layer 110 and a copper layer 112. The substrate 102 may be a semiconductor substrate. The substrate 102 may be composed of a single-crystalline semiconductor material or a compound semiconductor material. For example, silicon or germanium may be used as a material forming the substrate 102. In some exemplary examples, the substrate 102 is composed of silicon.

The dielectric structure 104 is disposed over a surface 114 of the substrate 102. In some examples, as shown in FIG. 1, the dielectric structure 104 includes various dielectric films 104a, 104b, 104c, 104d, 104e, 104f and 104g stacked on each other. The dielectric films 104a, 104b, 104c, 104d, 104e, 104f and 104g sequentially stack over the surface 114 of the substrate 102. Materials of the dielectric films 104a, 104b, 104c, 104d, 104e, 104f and 104g may not be all the same. For example, the dielectric films 104a, 104b, 104c, 104d, 104e, 104f and 104g may be formed from different materials. A portion of the dielectric films 104a, 104b, 104c, 104d, 104e, 104f and 104g may be formed from the same material, and the other portion of the dielectric films 104a, 104b, 104c, 104d, 104e, 104f may be formed from different materials. In some exemplary examples, the materials of the dielectric films 104a, 104b, 104c, 104d, 104e, 104f and 104g are selected from a group consisting from silicon nitride, silicon carbide, silicon oxide, and combinations thereof.

The dielectric structure 104 has a through via hole 116 passing through the dielectric structure 104. A sidewall 118 of the through via hole 116 includes at least one indentation 120. For example, as shown in FIG. 1, the sidewall 118 of the through via hole 116 includes various indentations 120. In some exemplary examples, the indentations 120 are respectively recessed in the dielectric films 104b, 104d and 104f.

Optionally, the semiconductor device 100 may further include a first dielectric layer 122 and/or a second dielectric layer 124. In the examples that the semiconductor device 100 includes the first dielectric layer 122 and the second dielectric layer 124, the first dielectric layer 122 may be disposed under the dielectric structure 104, and the second dielectric layer 124 may be disposed above the dielectric structure 104, such that the dielectric structure 104 is sandwiched between the first dielectric layer 122 and the second dielectric layer 124, as shown in FIG. 1. For example, the dielectric structure 104 may be an inter-metal dielectric layer. In some exemplary examples, the through via hole 116 sequentially passes through the second dielectric layer 124, the dielectric structure 104 and the first dielectric layer 122, and the through via hole 116 may be a hole for a multi-damascene structure, such a hole for a triple-damascene structure.

The indentations 120 may be only formed in the dielectric structure 104, or may be formed in the dielectric structure 104, the second dielectric layer 124 and/or the first dielectric layer 122. In some exemplary examples, each of the first dielectric layer 122 and the second dielectric layer 124 is formed from one single dielectric material while the dielectric structure 104 includes the dielectric films 104a, 104b, 104c, 104d, 104e, 104f and 104g, and the materials of the dielectric films 104a, 104b, 104c, 104d, 104e, 104f and 104g are not all the same. The material of the first dielectric layer 122 may be the same as that of the second dielectric layer 124, or may be different from that of the second dielectric layer 124.

Referring to FIG. 1 again, the barrier layer 106 conformally covers the sidewall 118 and a bottom 128 of the through via hole 116. The barrier layer 106 is suitable to prevent copper from diffusing into the dielectric structure 104 and/or substrate 102. In some exemplary examples, the barrier layer 106 includes a tantalum nitride layer or a titanium nitride layer. The glue layer 108 conformally covers the barrier layer 106 covering the sidewall 118 of the through via hole 116. In some exemplary examples, the glue layer 108 includes a cobalt layer.

As shown in FIG. 1, the copper seed layer 110 conformally covers the glue layer 108. The copper seed layer 110 has superior adhesion ability to the glue layer 108, such that, when the copper seed layer 110 is formed on the glue layer 108, a self-agglomeration of copper of the copper seed layer 110 is prevented, and step coverage of the copper seed layer 110 is significantly enhanced, thereby increasing uniformity and continuity of the copper seed layer 110.

The copper layer 112 covers the copper seed layer 110 and fills the through via hole 116 to complete the formation of a through via 126. For example, the through via 126 may include a multi-damascene structure, such as a triple damascene structure. In some exemplary examples, the copper layer 112 is formed based on the copper seed layer 110 by using an electroplating technique. Because the copper seed layer 110 is uniform and continuous, resistivity distribution of the copper seed layer 110 is uniform, and the copper layer 112 formed based on the copper seed layer 110 is uniformly grown, thereby obtaining the through via 126 without void. Consequently, the electrical performance of the semiconductor device 100 is enhanced.

Figure 2A:
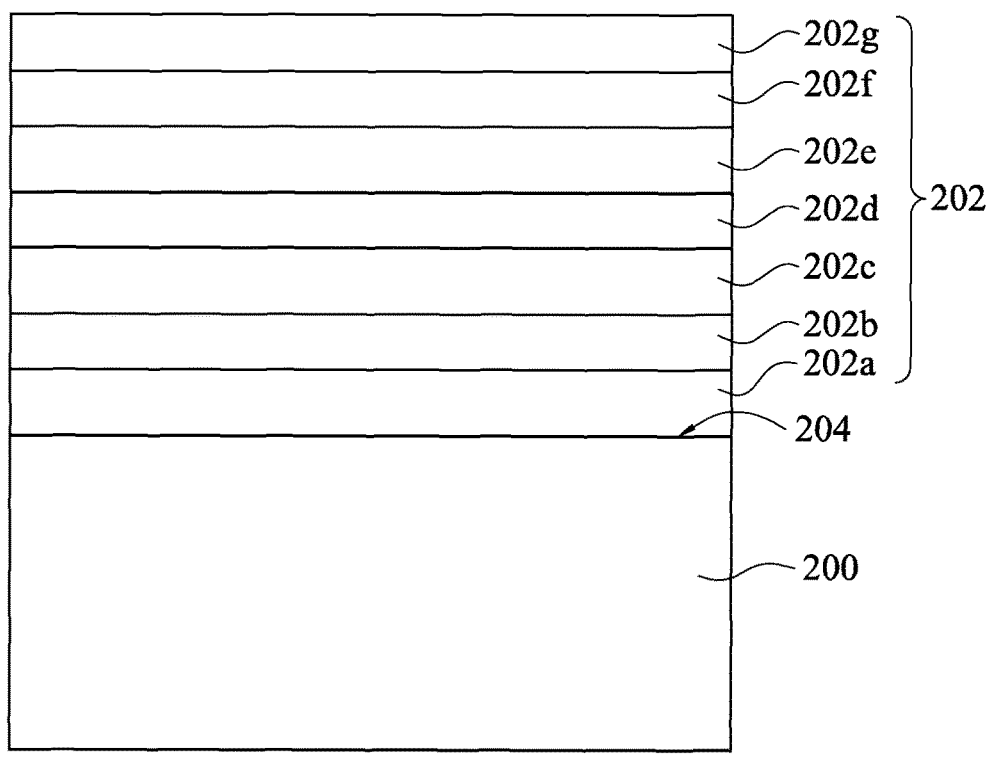
FIG. 2A through FIG. 2F are schematic cross-sectional views of intermediate stages showing a method for manufacturing a semiconductor device in accordance with various embodiments.

FIG. 2A through FIG. 2F are schematic cross-sectional views of intermediate stages showing a method for manufacturing a semiconductor device in accordance with various embodiments. As shown in FIG. 2A, a substrate 200 is provided. The substrate 200 may be a semiconductor substrate. The substrate 200 may be composed of a single-crystalline semiconductor material or a compound semiconductor material. In some exemplary examples, silicon or germanium is used as a material forming the substrate 200. In some examples, the substrate 200 includes a semiconductor base, and various metal layers and various interlayer dielectric layers disposed on the semiconductor base.

A dielectric structure 202 is formed on a surface 204 of the substrate 200. The operation of forming the dielectric structure 202 may be performed using a deposition technique, such as a chemical vapor deposition (CVD) technique or a physical vapor deposition (PVD) technique. In some examples, the operation of forming the dielectric structure 202 includes forming various dielectric films 202a, 202b, 202c, 202d, 202e, 202f and 202g stacked on each other. In some exemplary examples, materials of the dielectric films 202a, 202b, 202c, 202d, 202e, 202f and 202g are not all the same. For example, the dielectric films 202a, 202b, 202c, 202d, 202e, 202f and 202g may be formed from silicon nitride, silicon carbide or silicon oxide. Etching rates of the dielectric films 202a, 202b, 202c, 202d, 202e, 202f and 202g may be not all the same.

Figure 2B:
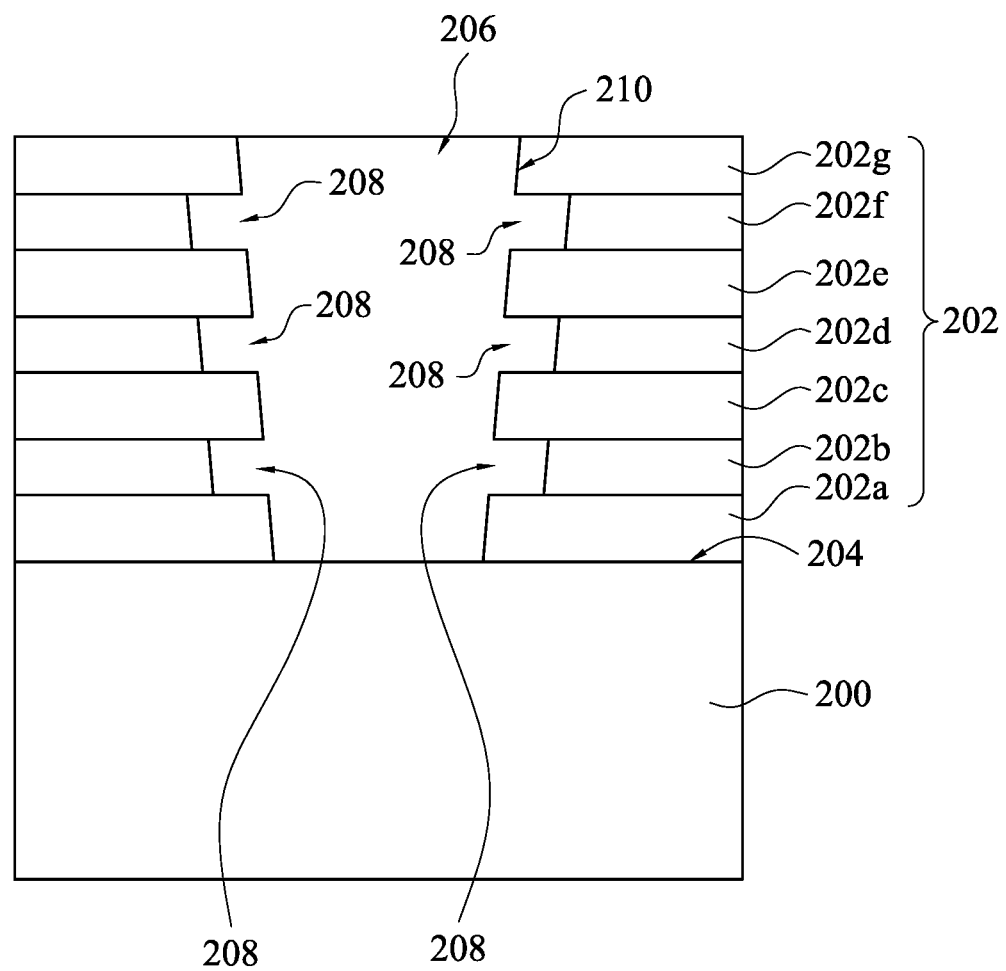

As shown in FIG. 2B, a through via hole 206 is formed in the dielectric structure 202. For example, the through via hole 206 may pass through the dielectric films 202a, 202b, 202c, 202d, 202e, 202f and 202g of the dielectric structure 202 and expose a portion of the surface 204 of the substrate 200. The operation of forming the through via hole 206 may include removing a portion of each of the dielectric films 202a, 202b, 202c, 202d, 202e, 202f and 202g using an etching technique, such as a dry etching technique. In some examples, in the operation of removing the portion of each of the dielectric films 202a, 202b, 202c, 202d, 202e, 202f and 202g, because the etching rates of the dielectric films 202a, 202b, 202c, 202d, 202e, 202f and 202g are not all the same, and the etching rate of at least one of the dielectric films 202a, 202b, 202c, 202d, 202e, 202f and 202g is greater than the etching rates of the others, at least one indentation 208 is formed in a sidewall 210 of the through via hole 206. For example, as shown in FIG. 2B, the etching rates of the dielectric films 202b, 202d and 202f may be greater than the etching rates of the others, and various indentations 208 may be respectively formed in the dielectric films 202b, 202d and 202f of the dielectric structure 202.

Figure 2C:
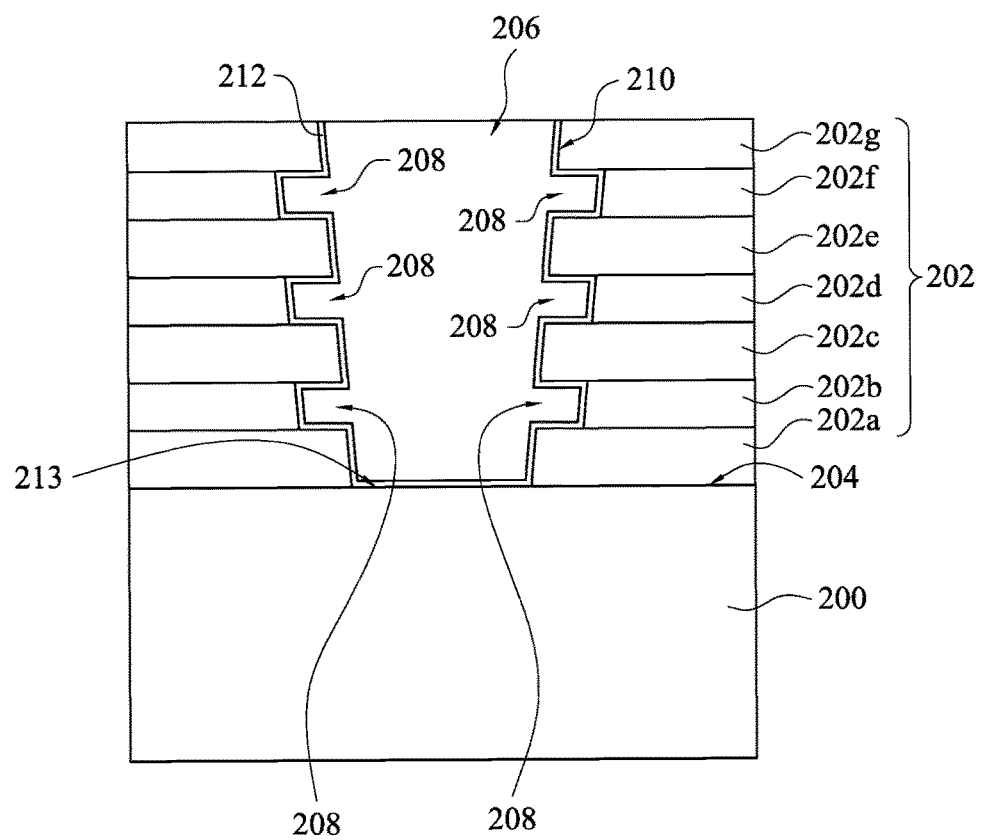

As shown in FIG. 2C, a barrier layer 212 is formed to conformally cover the sidewall 210 and a bottom 213 of the through via hole 206. For example, the operation of forming the barrier layer 212 may be performed using a PVD technique. The barrier layer 212 is suitable for use in preventing copper from diffusing into the dielectric structure 202 and the substrate 200. In some examples, the operation of forming the barrier layer 212 forms the barrier layer 212 including a tantalum nitride layer or a titanium nitride layer.

Figure 2D:
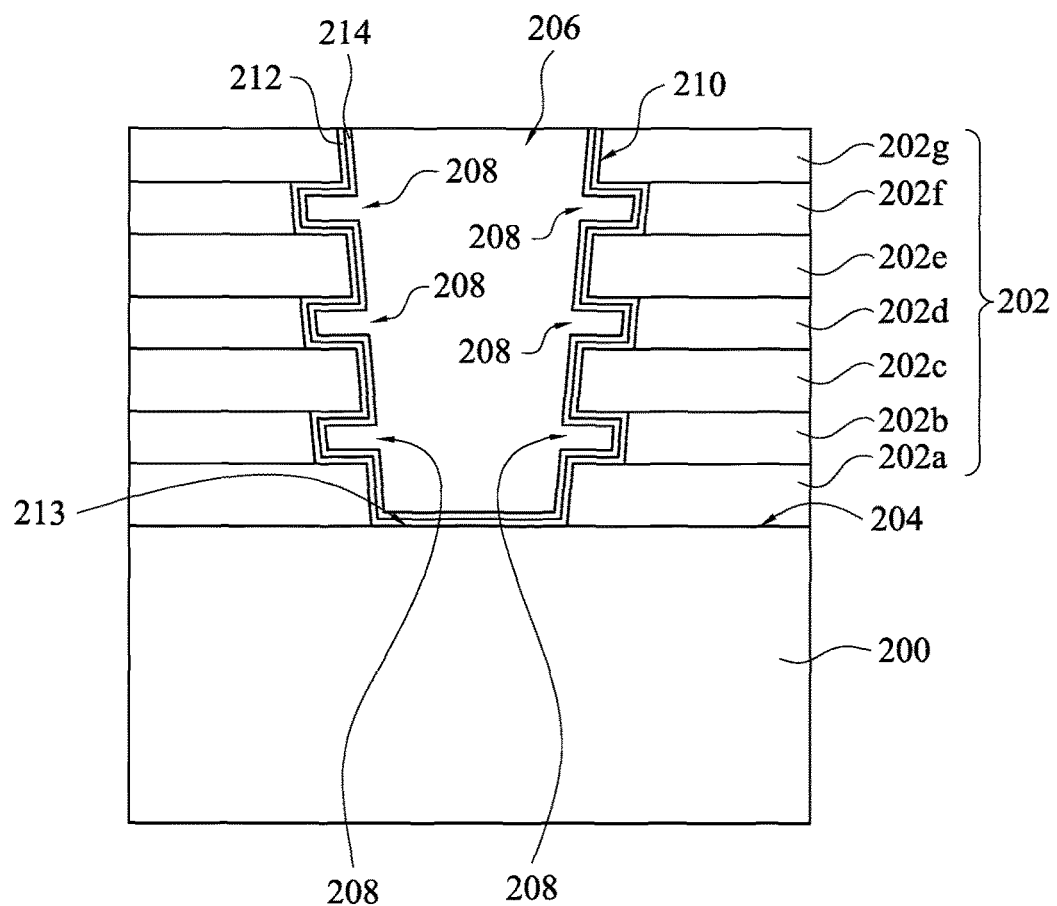

As shown in FIG. 2D, a glue layer 214 is formed to conformally cover the barrier layer 212. For example, the operation of forming the glue layer 214 may be performed using a CVD technique, such as a metal organic chemical vapor deposition (MOCVD) technique. The CVD technique has good step coverage ability, such that the glue layer 214 formed by using the CVD technique covers the barrier layer 212 conformally, uniformly and continuously. The glue layer 214 has superior adhesion to copper, such that the glue layer 214 can be used as a glue medium for a copper seed layer 216 (referring to FIG. 2E). In some examples, the operation of forming the glue layer 214 forms the glue layer 214 including a cobalt layer.

Figure 2E:
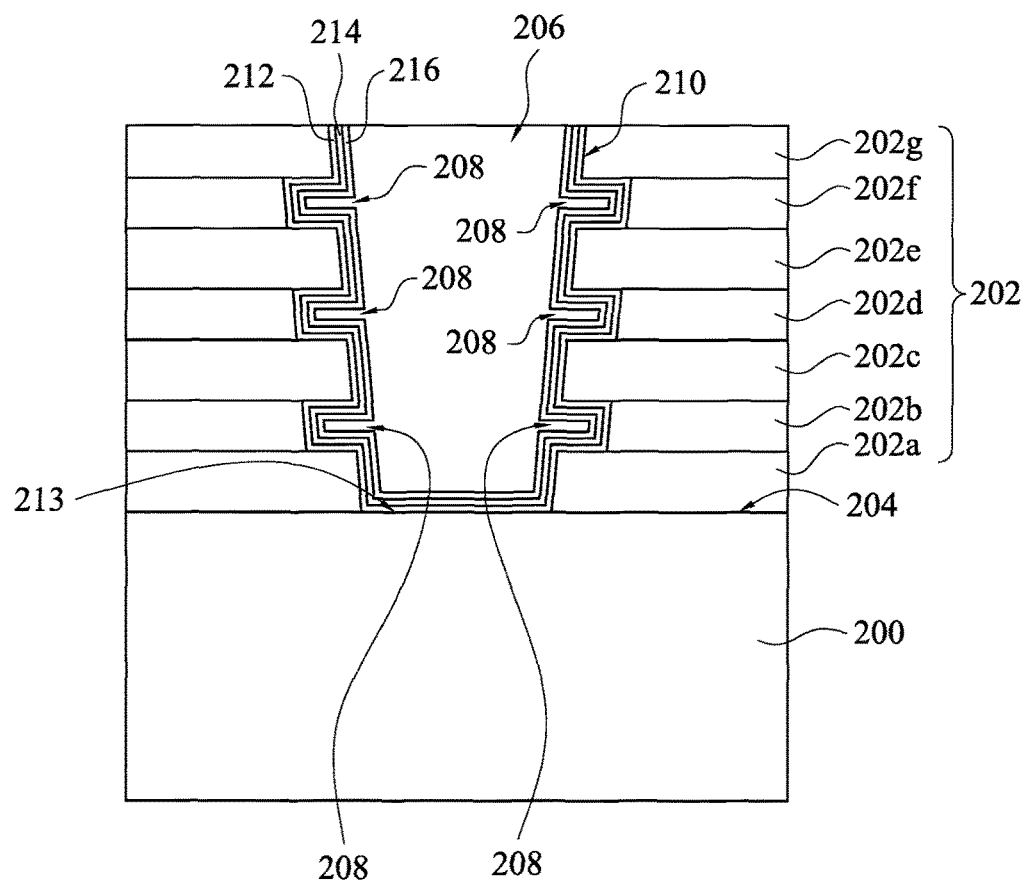

As shown in FIG. 2E, a copper seed layer 216 is formed to conformally cover the glue layer 214. For example, the operation of forming the copper seed layer 216 may be performed using a PVD technique, a CVD technique or an atomic layer deposition (ALD) technique. The copper seed layer 216 has good adhesion to the glue layer 214, such that, when the copper seed layer 216 is formed on the glue layer 214, a self-agglomeration of copper of the copper seed layer 216 is effectively eliminated, and step coverage of the copper seed layer 216 is significantly enhanced, thereby increasing uniformity and continuity of the copper seed layer 216.

Figure 2F:
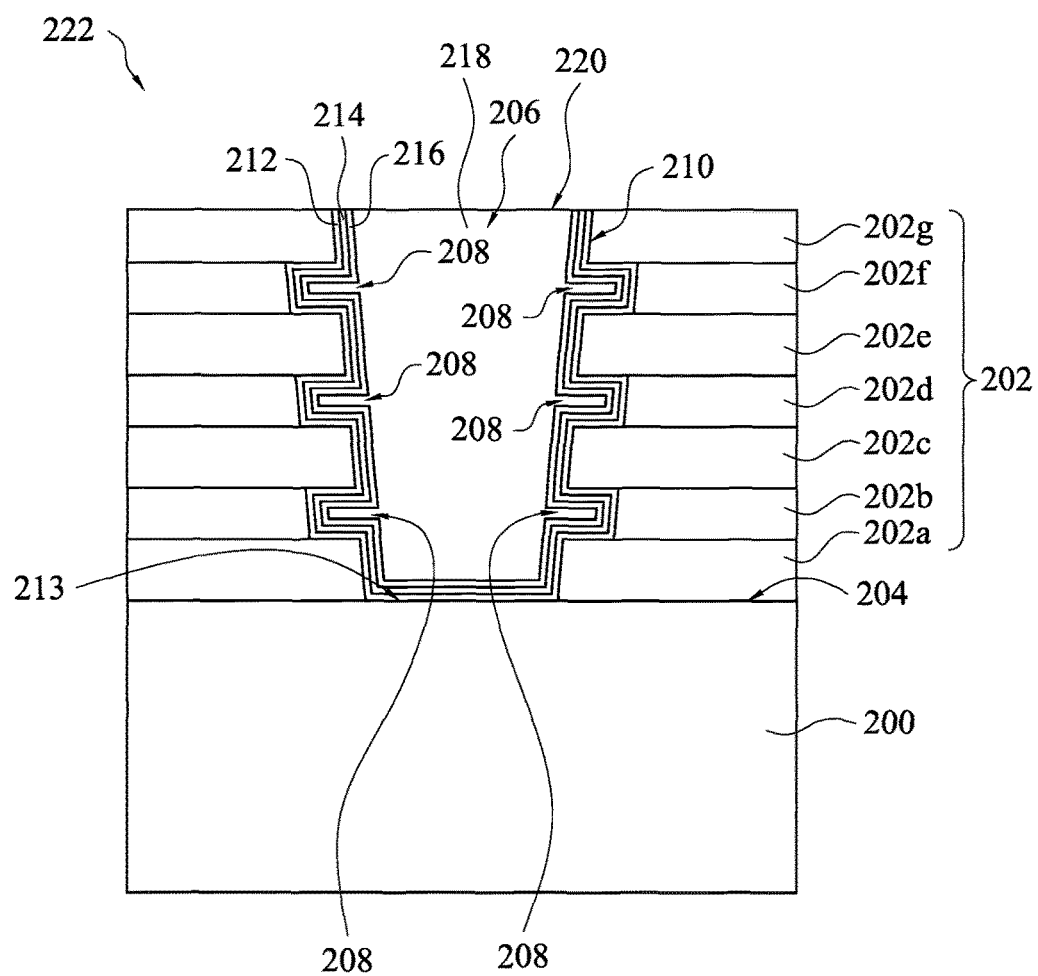

As shown in FIG. 2F, a copper layer 218 is formed to cover the copper seed layer 216 and fill the through via hole 206 to form a through via 220, so as to complete the formation of a semiconductor device 222. The through via 220 includes the barrier layer 212, the glue layer 214, the copper seed layer 216 and the copper layer 218. The copper layer 218 is used as an interconnecting layer in the semiconductor device 222. For example, the operation of forming the copper layer 218 may be performed based on the copper seed layer 216 using an electroplating technique.

With the glue layer 214 forming between the barrier layer 212 and the copper seed layer 216, the copper seed layer 216 is uniform and continuous, and resistivity distribution of the copper seed layer 216 is uniform, such that the copper layer 218 formed based on the copper seed layer 216 is uniformly grown, thereby obtaining the through via 220 without void. Thus, the electrical performance of the semiconductor device 222 is enhanced.

Figure 3:
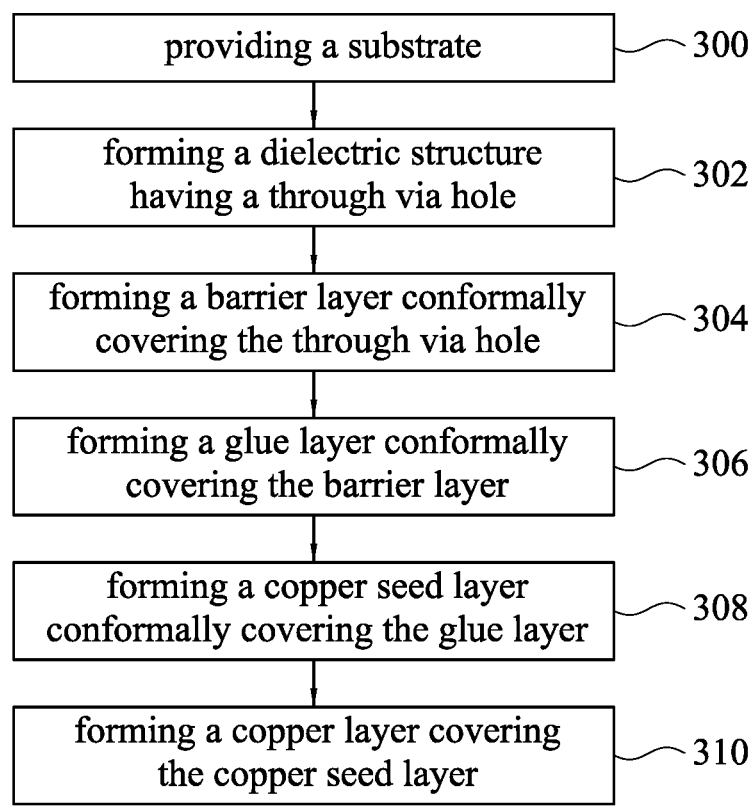
FIG. 3 is a flow chart of a method for manufacturing a semiconductor device in accordance with various embodiments.

Referring to FIG. 3 with FIG. 2A through FIG. 2F, FIG. 3 is a flow chart of a method for manufacturing a semiconductor device in accordance with various embodiments. The method begins at operation 300, where a substrate 200 is provided. The substrate 200 may be a semiconductor substrate, such as a single-crystalline semiconductor substrate or a compound semiconductor substrate. In some exemplary examples, silicon or germanium is used as a material forming the substrate 200. In some examples, the substrate 200 includes a semiconductor base, and various metal layers and various interlayer dielectric layers disposed on the semiconductor base.

At operation 302, as shown in FIG. 2A, a dielectric structure 202 is formed on a surface 204 of the substrate 200 using a deposition technique, such as a CVD technique or a PVD technique. In some examples, the operation of forming the dielectric structure 202 includes forming various dielectric films 202a, 202b, 202c, 202d, 202e, 202f and 202g stacked on each other. In some exemplary examples, materials of the dielectric films 202a, 202b, 202c, 202d, 202e, 202f and 202g are not all the same. For example, the dielectric films 202a, 202b, 202c, 202d, 202e, 202f and 202g may be formed from silicon nitride, silicon carbide or silicon oxide. Etching rates of the dielectric films 202a, 202b, 202c, 202d, 202e, 202f and 202g may be not all the same.

As shown in FIG. 2B, the operation of forming the dielectric structure 202 includes forming the dielectric structure 202 having a through via hole 206. For example, the through via hole 206 may pass through the dielectric films 202a, 202b, 202c, 202d, 202e, 202f and 202g of the dielectric structure 202 and expose a portion of the surface 204 of the substrate 200. The operation of forming the through via hole 206 may include removing a portion of each of the dielectric films 202a, 202b, 202c, 202d, 202e, 202f and 202g using an etching technique, such as a dry etching process. In some examples, in the operation of removing the portion of each of the dielectric films 202a, 202b, 202c, 202d, 202e, 202f and 202g, at least one indentation 208 is formed in a sidewall 210 of the through via hole 206. For example, as shown in FIG. 2B, various indentations 208 may be respectively formed in the dielectric films 202b, 202d and 202f of the dielectric structure 202.

At operation 304, as shown in FIG. 2C, a barrier layer 212 is formed to conformally cover the sidewall 210 and a bottom 213 of the through via hole 206 using, for example, a PVD technique. The barrier layer 212 is suitable for use in preventing copper from diffusing into the dielectric structure 202 and the substrate 200. In some examples, the operation of forming the barrier layer 212 forms the barrier layer 212 including a tantalum nitride layer or a titanium nitride layer.

At operation 306, as shown in FIG. 2D, a glue layer 214 is formed to conformally cover the barrier layer 212. For example, the operation of forming the glue layer 214 may be performed using a CVD technique, such as a MOCVD technique. The CVD technique has good step coverage ability, such that the glue layer 214 formed by using the CVD technique covers the barrier layer 212 conformally, uniformly and continuously. The glue layer 214 has superior adhesion to copper, such that the glue layer 214 can be used as a glue medium for a copper seed layer 216 (referring to FIG. 2E). In some examples, the glue layer 214 is formed from cobalt.

At operation 308, as shown in FIG. 2E, a copper seed layer 216 is formed to conformally cover the glue layer 214 using, for example, a PVD technique, a CVD technique or an atomic layer deposition (ALD) technique. The copper seed layer 216 has good adhesion to the glue layer 214, such that, when the copper seed layer 216 is formed on the glue layer 214, a self-agglomeration of copper of the copper seed layer 216 is prevented, and step coverage of the copper seed layer 216 is significantly enhanced, thereby increasing uniformity and continuity of the copper seed layer 216.

At operation 310, as shown in FIG. 2F, a copper layer 218 is formed to cover the copper seed layer 216 and fill the through via hole 206 to form a through via 220, so as to complete the formation of a semiconductor device 222. For example, the operation of forming the copper layer 218 may be performed based on the copper seed layer 216 by using an electroplating technique.

Figure 4A:
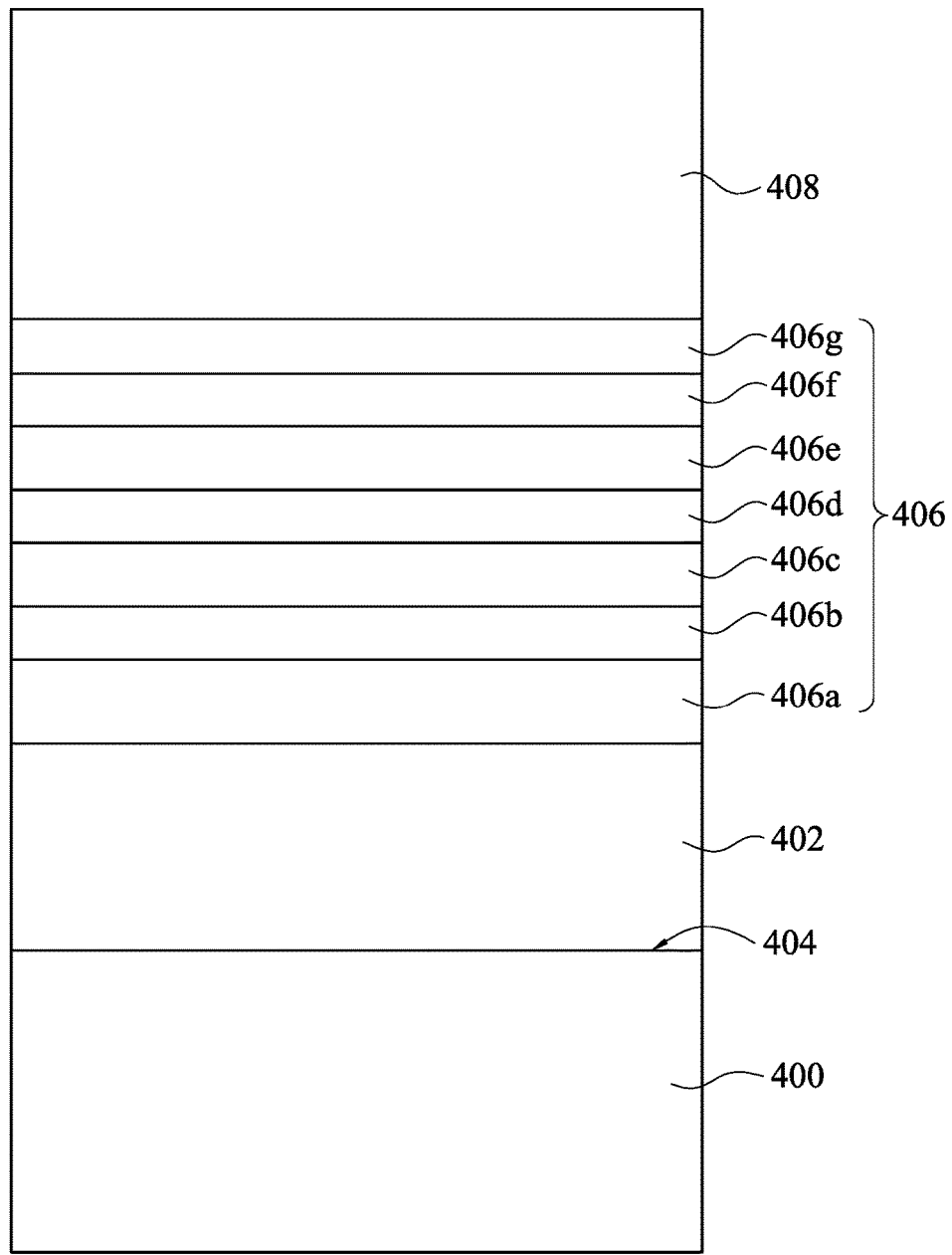
FIG. 4A through FIG. 4F are schematic cross-sectional views of intermediate stages showing a method for manufacturing a semiconductor device in accordance with various embodiments.

FIG. 4A through FIG. 4F are schematic cross-sectional views of intermediate stages showing a method for manufacturing a semiconductor device in accordance with various embodiments. As shown in FIG. 4A, a substrate 400 is provided. The substrate 400 may be a semiconductor substrate. The substrate 400 may be composed of a single-crystalline semiconductor material or a compound semiconductor material. In some exemplary examples, silicon or germanium is used as a material forming the substrate 400.

A first dielectric layer 402 is formed over a surface 404 of the substrate 400. The operation of forming the first dielectric layer 402 may be performed using a deposition technique, such as a CVD technique or a PVD technique. In some certain examples, the first dielectric layer 402 is formed from one single dielectric material. For example, the first dielectric layer 402 may be formed from silicon dielectric, silicon nitride or silicon carbide.

A dielectric structure 406 is formed on the first dielectric layer 402. The operation of forming the dielectric structure 202 may be performed using a deposition technique, such as a CVD technique or a PVD technique. In some examples, as shown in FIG. 4A, the operation of forming the dielectric structure 406 includes forming various dielectric films 406a, 406b, 406c, 406d, 406e, 406f and 406g stacked on each other. In some exemplary examples, materials of the dielectric films 406a, 406b, 406c, 406d, 406e, 406f and 406g are not all the same. For example, the dielectric films 406a, 406b, 406c, 406d, 406e, 406f and 406g may be formed from silicon nitride, silicon carbide or silicon oxide. Etching rates of the dielectric films 406a, 406b, 406c, 406d, 406e, 406f and 406g may be not all the same.

Referring to FIG. 4A again, a second dielectric layer 408 is formed on the dielectric structure 406. The operation of forming the second dielectric layer 408 may be performed using a deposition technique, such as a CVD technique or a PVD technique. In some certain examples, the second dielectric layer 408 is formed from one single dielectric material. For example, the second dielectric layer 408 may be formed from silicon dielectric, silicon nitride or silicon carbide. The first dielectric layer 402 may be disposed under the dielectric structure 406, and the second dielectric layer 408 may be disposed above the dielectric structure 406, such that the dielectric structure 406 is sandwiched between the first dielectric layer 402 and the second dielectric layer 408. For example, the dielectric structure 406 may be an intermetal dielectric layer.

Figure 4B:
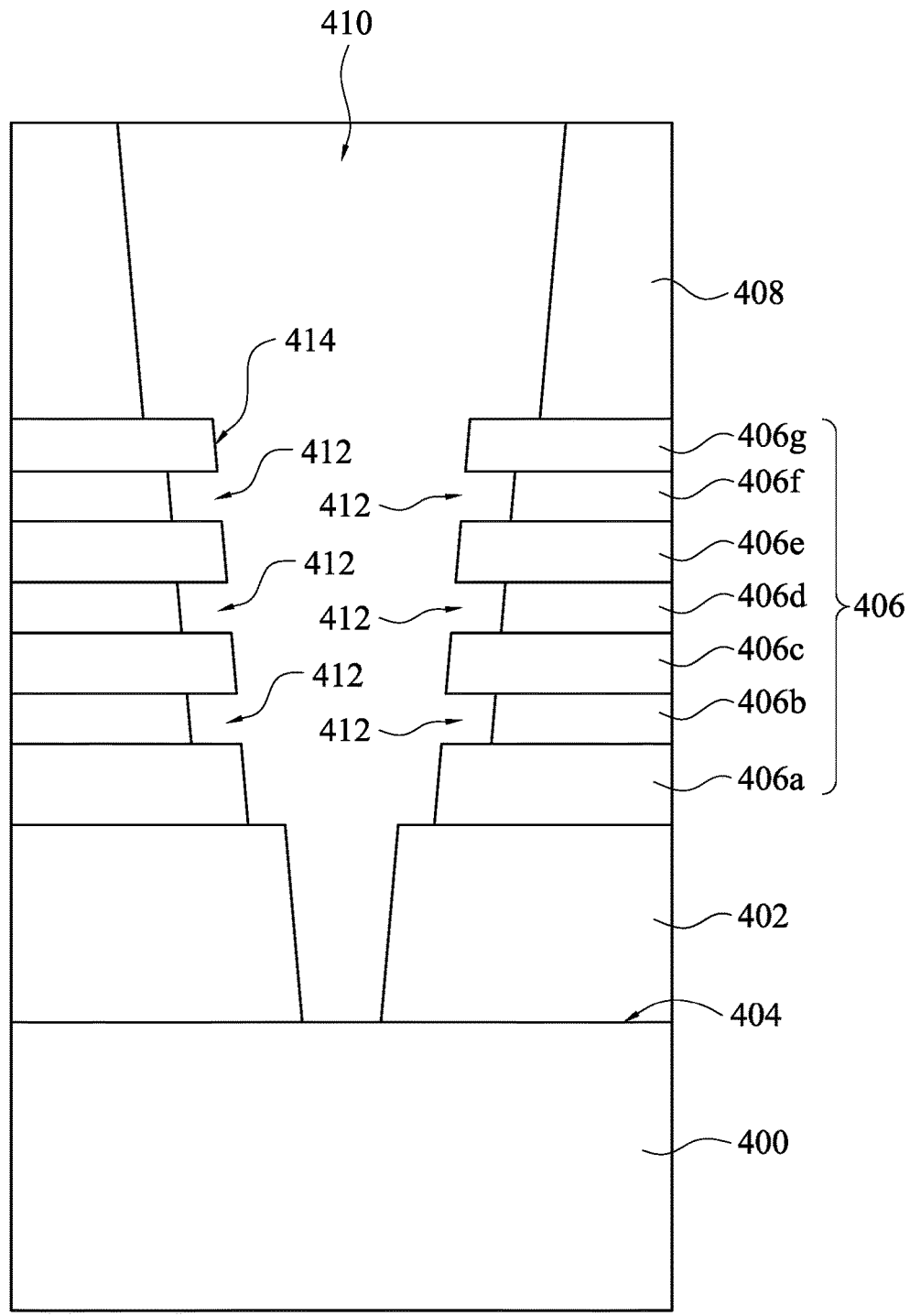

As shown in FIG. 4B, a through via hole 410 is formed in the second dielectric layer 408, the dielectric structure 406 and the first dielectric layer 402. For example, the through via hole 410 may pass through the second dielectric layer 408, the dielectric films 406a, 406b, 406c, 406d, 406e, 406f and 406g of the dielectric structure 406, and the first dielectric layer 402, and expose a portion of the surface 404 of the substrate 400. In some exemplary examples, the through via hole 410 is a hole for a multi-damascene structure, such a hole for a triple-damascene.

The operation of forming the through via hole 410 may include removing a portion of each of the second dielectric layer 408, the dielectric structure 406 and the first dielectric layer 402 using an etching technique, such as a dry etching process. In some examples, in the operation of removing the portion of each of the second dielectric layer 408, the dielectric structure 406 and the first dielectric layer 402, because the etching rates of the dielectric films 406a, 406b, 406c, 406d, 406e, 406f and 406g are not all the same, and the etching rate of at least one of the dielectric films 406a, 406b, 406c, 406d, 406e, 406f and 406g is greater than the etching rates of the others, at least one indentation 412 is formed in a sidewall 414 of the through via hole 410. For example, as shown in FIG. 4B, the etching rates of the dielectric films 406b, 406d and 406f may be greater than the etching rates of the others, and various indentations 412 may be respectively formed in the dielectric films 406b, 406d and 406f of the dielectric structure 406.

Figure 4C:
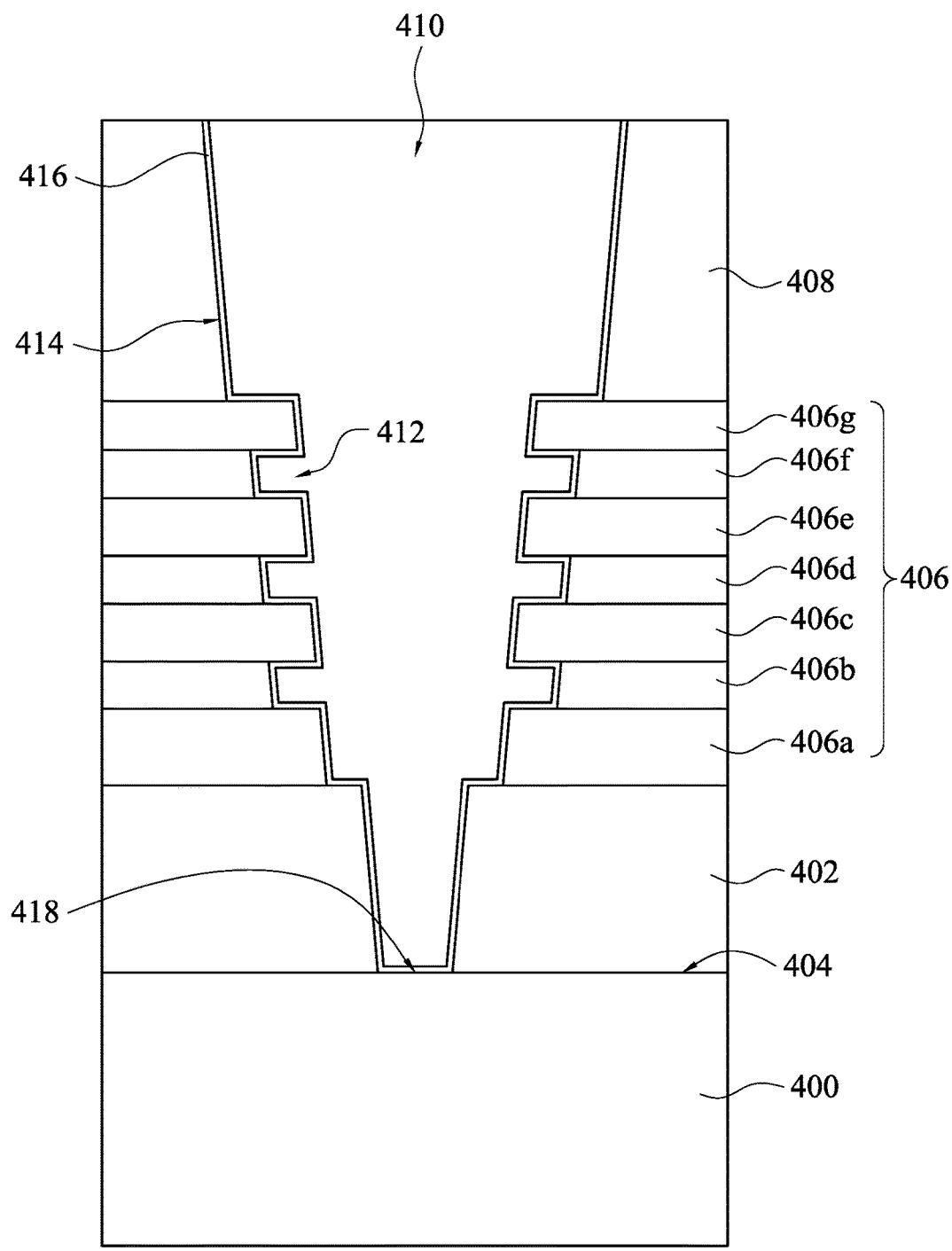

As shown in FIG. 4C, a barrier layer 416 is formed to conformally cover the sidewall 414 and a bottom 418 of the through via hole 410. For example, the operation of forming the barrier layer 416 may be performed using a PVD technique. The barrier layer 416 is suitable for use in preventing copper from diffusing into the second dielectric layer 408, the dielectric structure 406, the first dielectric layer 402 and the substrate 400. In some examples, the operation of forming the barrier layer 416 forms the barrier layer 416 including a tantalum nitride layer or a titanium nitride layer.

Figure 4D:
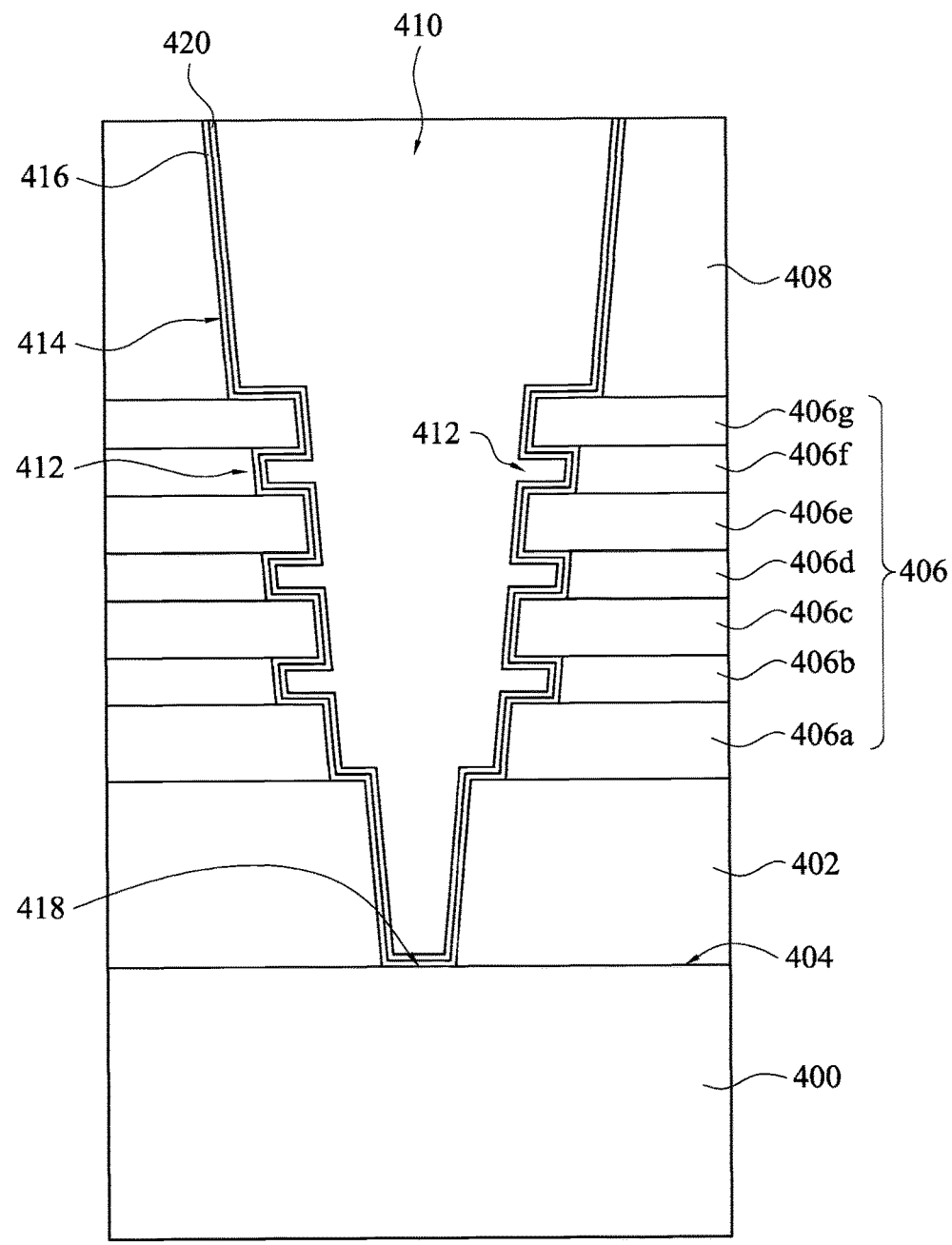

As shown in FIG. 4D, a glue layer 420 is formed to conformally cover the barrier layer 416. For example, the operation of forming the glue layer 420 may be performed using a CVD technique, such as a MOCVD technique. The CVD technique has good step coverage ability, such that the glue layer 420 formed by using the CVD technique can cover the barrier layer 416 conformally, uniformly and continuously. The glue layer 420 has superior adhesion to copper, such that the glue layer 420 can be used as a glue medium for a copper seed layer 422 (referring to FIG. 4E). In some examples, the glue layer 420 is formed to include a cobalt layer.

Figure 4E:
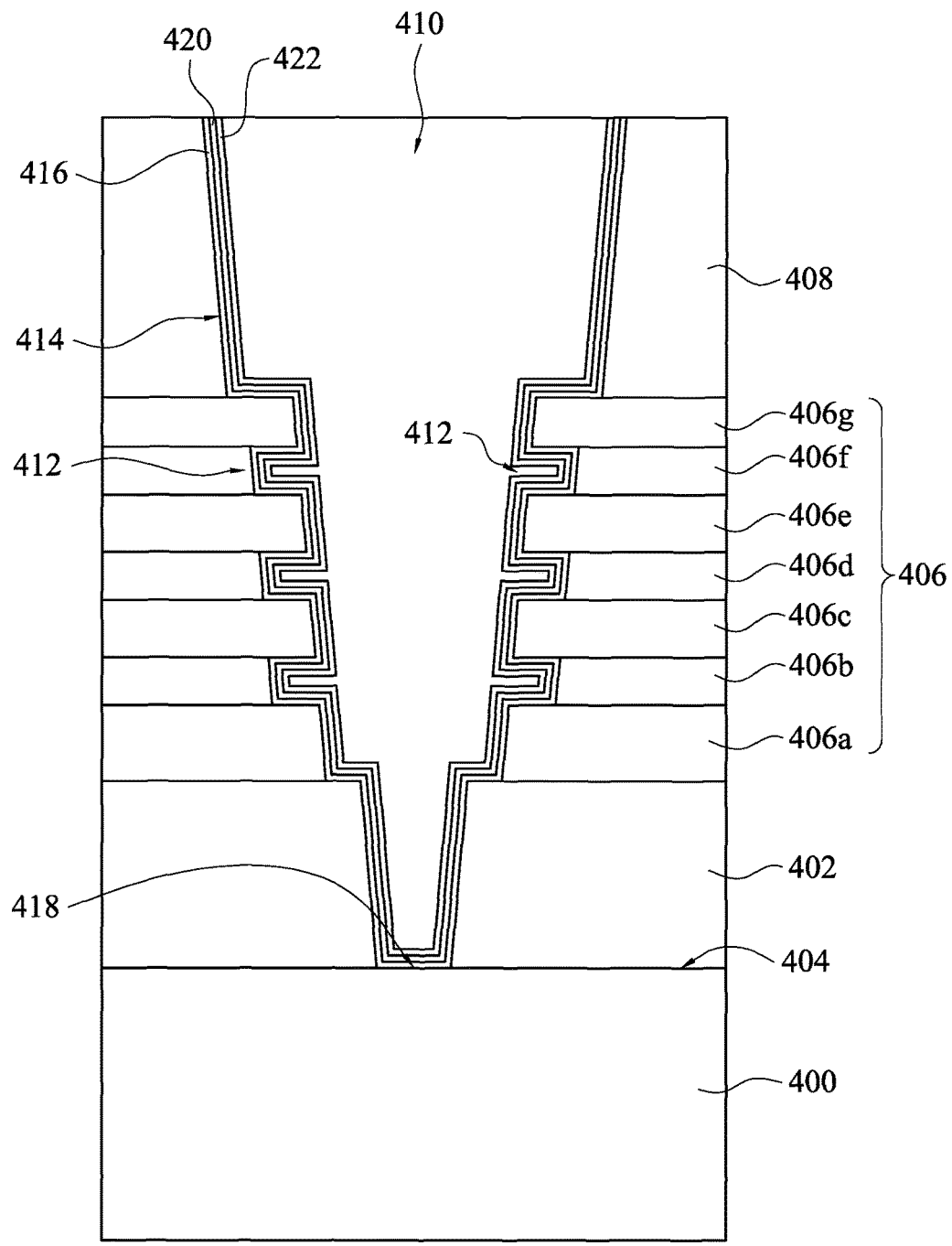

As shown in FIG. 4E, a copper seed layer 422 is formed to conformally cover the glue layer 420. For example, the operation of forming the copper seed layer 422 may be performed using a PVD technique, a CVD technique or an ALD technique. The copper seed layer 422 has good adhesion to the glue layer 420, such that, when the copper seed layer 422 is formed on the glue layer 420, a self-agglomeration of copper of the copper seed layer 422 is effectively eliminated, and step coverage of the copper seed layer 420 is significantly enhanced, thereby increasing uniformity and continuity of the copper seed layer 420.

Figure 4F:
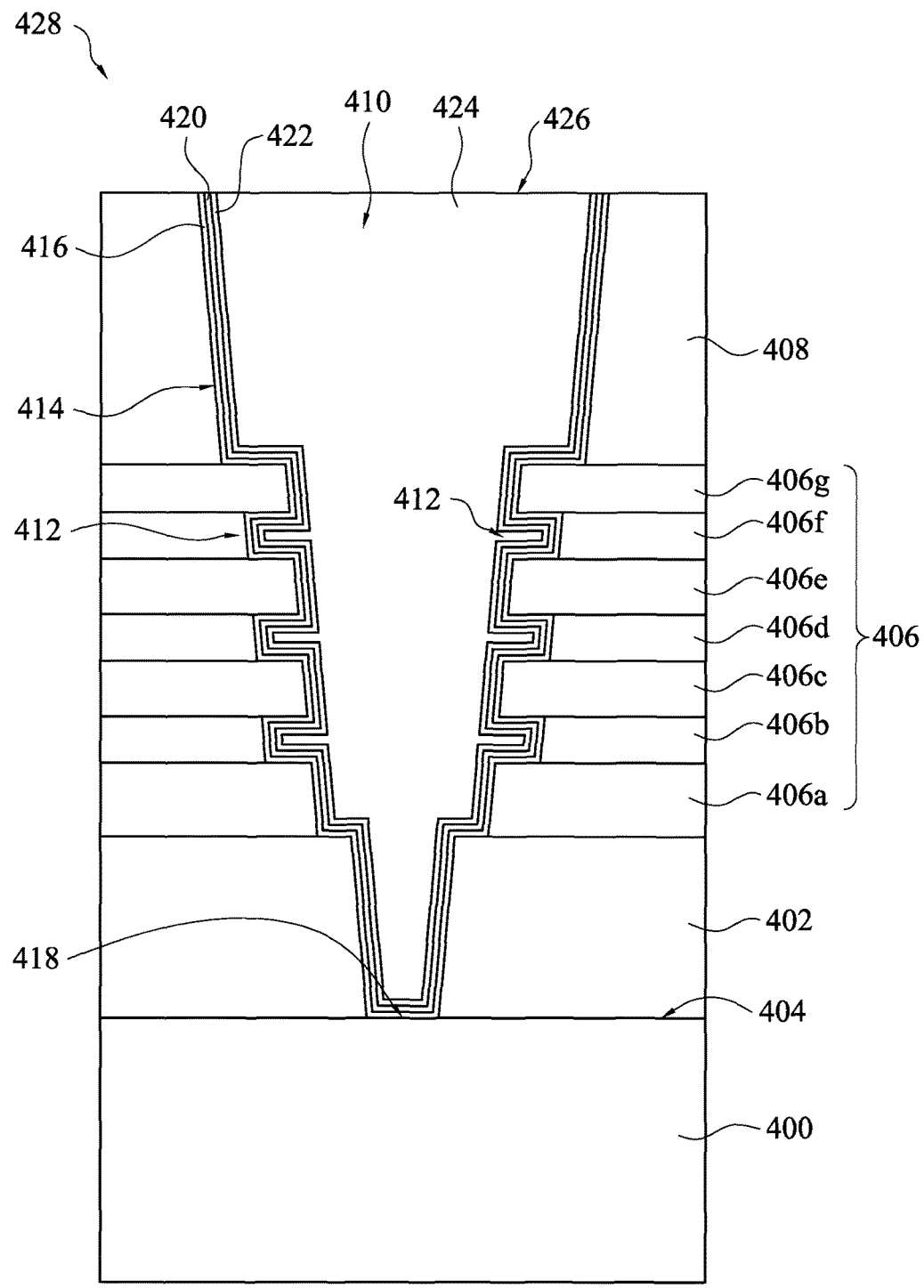

As shown in FIG. 4F, a copper layer 424 is formed to cover the copper seed layer 422 and fill the through via hole 410 to form a through via 426, so as to complete the formation of a semiconductor device 428. The through via 426 includes the barrier layer 416, the glue layer 420, the copper seed layer 422 and the copper layer 424. The copper layer 424 is used as an interconnecting layer in the semiconductor device 428. For example, the operation of forming the copper layer 424 may be performed based on the copper seed layer 422 by using an electroplating technique.

With the glue layer 410 forming between the barrier layer 416 and the copper seed layer 422, the copper seed layer 422 is formed uniformly and continuously, and resistivity distribution of the copper seed layer 422 is uniform, such that the copper layer 424 formed based on the copper seed layer 422 is uniformly grown, thereby obtaining the through via 426 without void. Thus, the electrical performance of the semiconductor device 428 is enhanced.

Figure 5:
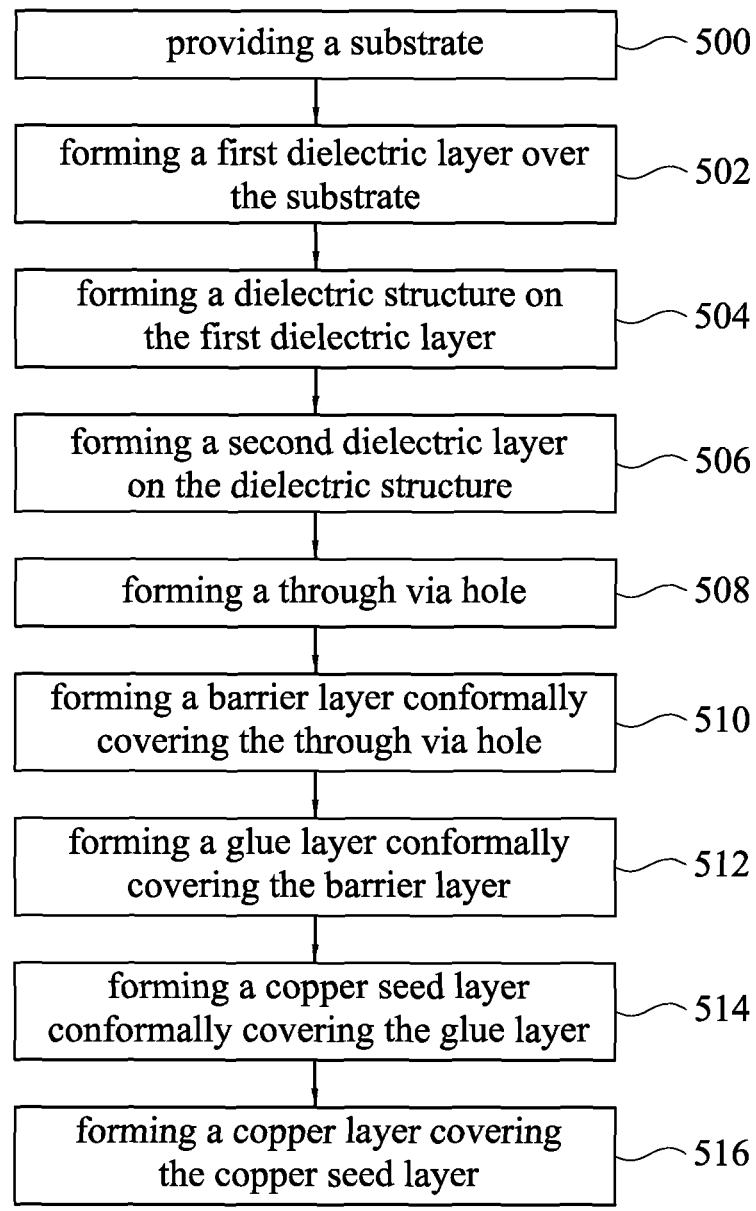
FIG. 5 is a flow chart of a method for manufacturing a semiconductor device in accordance with various embodiments.

Referring to FIG. 5 with FIG. 4A through FIG. 4F, FIG. 5 is a flow chart of a method for manufacturing a semiconductor device in accordance with various embodiments. The method begins at operation 500, where a substrate 400 is provided. The substrate 400 may be a semiconductor substrate, such as a single-crystalline semiconductor substrate or a compound semiconductor substrate. In some exemplary examples, silicon or germanium is used as a material forming the substrate 400.

At operation 502, a first dielectric layer 402 is formed over a surface 404 of the substrate 400 using a deposition technique, such as a CVD technique or a PVD technique. In some certain examples, the first dielectric layer 402 is formed from one single dielectric material. For example, the first dielectric layer 402 may be formed from silicon dielectric, silicon nitride or silicon carbide.

At operation 504, a dielectric structure 406 is formed on the first dielectric layer 402 using a deposition technique, such as a CVD technique or a PVD technique. In some examples, as shown in FIG. 4A, the operation of forming the dielectric structure 406 includes forming various dielectric films 406a, 406b, 406c, 406d, 406e, 406f and 406g stacked on each other. In some exemplary examples, materials of the dielectric films 406a, 406b, 406c, 406d, 406e, 406f and 406g are not all the same. For example, the dielectric films 406a, 406b, 406c, 406d, 406e, 406f and 406g may be formed from silicon nitride, silicon carbide or silicon oxide. Etching rates of the dielectric films 406a, 406b, 406c, 406d, 406e, 406f and 406g may be not all the same.

At operation 506, referring to FIG. 4A again, a second dielectric layer 408 is formed on the dielectric structure 406 using a deposition technique, such as a CVD technique or a PVD technique. In some certain examples, the second dielectric layer 408 is formed from one single dielectric material. For example, the second dielectric layer 408 may be formed from silicon dielectric, silicon nitride or silicon carbide. The first dielectric layer 402 may be disposed under the dielectric structure 406, and the second dielectric layer 408 may be disposed above the dielectric structure 406, such that the dielectric structure 406 is sandwiched between the first dielectric layer 402 and the second dielectric layer 408. For example, the dielectric structure 406 may be an intermetal dielectric layer.

At operation 508, as shown in FIG. 4B, a through via hole 410 is formed in the second dielectric layer 408, the dielectric structure 406 and the first dielectric layer 402. For example, the through via hole 410 may pass through the second dielectric layer 408, the dielectric films 406a, 406b, 406c, 406d, 406e, 406f and 406g of the dielectric structure 406, and the first dielectric layer 402, and expose a portion of the surface 404 of the substrate 400. In some exemplary examples, the through via hole 410 is a hole for a multi-damascene structure, such a hole for a triple-damascene structure.

The operation of forming the through via hole 410 may include removing a portion of each of the second dielectric layer 408, the dielectric structure 406 and the first dielectric layer 402 using an etching technique, such as a dry etching technique. In some examples, in the operation of forming the through via hole 410, at least one indentation 412 is formed in a sidewall 414 of the through via hole 410. For example, as shown in FIG. 4B, various indentations 412 may be respectively formed in the dielectric films 406b, 406d and 406f of the dielectric structure 406.

At operation 510, as shown in FIG. 4C, a barrier layer 416 is formed to conformally cover the sidewall 414 and a bottom 418 of the through via hole 410 using, for example, a PVD technique. The barrier layer 416 is suitable for use in preventing copper from diffusing into the second dielectric layer 408, the dielectric structure 406, the first dielectric layer 402 and the substrate 400. In some examples, the barrier layer 416 is formed to include a tantalum nitride layer or a titanium nitride layer.

At operation 512, as shown in FIG. 4D, a glue layer 420 is formed to conformally cover the barrier layer 416 using a CVD technique, such as a MOCVD technique. The CVD technique has good step coverage ability, such that the glue layer 420 formed by using the CVD technique can conformally, uniformly and continuously cover the barrier layer 416. The glue layer 420 has superior adhesion to copper. In some examples, the glue layer 420 is formed from cobalt.

At operation 514, as shown in FIG. 4E, a copper seed layer 422 is formed to conformally cover the glue layer 420 using, for example, a PVD technique, a CVD technique or an ALD technique. The copper seed layer 422 has good adhesion to the glue layer 420, such that, when the copper seed layer 422 is formed on the glue layer 420, a self-agglomeration of copper of the copper seed layer 422 is effectively eliminated, and step coverage of the copper seed layer 420 is significantly enhanced, thereby increasing uniformity and continuity of the copper seed layer 420.

At operation 516, as shown in FIG. 4F, a copper layer 424 is formed to cover the copper seed layer 422 and fill the through via hole 410 to form a through via 426, so as to complete the formation of a semiconductor device 428. The through via 426 includes the barrier layer 416, the glue layer 420, the copper seed layer 422 and the copper layer 424. For example, the operation of forming the copper layer 424 may be performed based on the copper seed layer 422 by using an electroplating technique.

In accordance with an embodiment, the present disclosure discloses a semiconductor device. The semiconductor device includes a substrate, a dielectric structure, a barrier layer, a glue layer, a copper seed layer and a copper layer. The dielectric structure is disposed over the substrate. The dielectric structure has a through via hole passing through the dielectric structure, and a sidewall of the through via hole includes at least one indentation. The barrier layer conformally covers the sidewall and a bottom of the through via hole. The glue layer conformally covers the barrier layer. The copper seed layer conformally covers the glue layer. The copper layer covers the copper seed layer and fills the through via hole.

In accordance with another embodiment, the present disclosure discloses a method for manufacturing a semiconductor device. In this method, a substrate is provided. A dielectric structure is formed over the substrate, in which the dielectric structure is formed to have a through via hole passing through the dielectric structure, and a sidewall of the through via hole includes at least one indentation. A barrier layer is formed to conformally cover the sidewall and a bottom of the through via hole. A glue layer is formed to conformally cover the barrier layer. A copper seed layer is formed to conformally cover the glue layer. A copper layer is formed to cover the copper seed layer and filling the through via hole.

In accordance with yet another embodiment, the present disclosure discloses a method for manufacturing a semiconductor device. In this method, a substrate is provided. A first dielectric layer is formed over the substrate. A dielectric structure is formed on the first dielectric layer. The operation of forming the dielectric structure forms the dielectric structure including various dielectric films stacked on each other, and materials of the dielectric films are not all the same. A second dielectric layer is formed on the dielectric structure. A through via hole is formed to pass through the second dielectric layer, the dielectric structure and the first dielectric layer. A barrier layer is formed to conformally cover the sidewall and a bottom of the through via hole. A glue layer is formed to conformally cover the barrier layer. A copper seed layer is formed to conformally cover the glue layer. A copper layer is formed to cover the copper seed layer and filling the through via hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a dielectric structure disposed over the substrate, wherein the dielectric structure has a through via hole passing through the dielectric structure, the through via hole comprises a bottom and a sidewall adjacent to the bottom, and the sidewall of the through via hole comprises at least one indentation structure, wherein the at least one indentation structure has a substantially C-shaped cross-section, and the at least one indentation structure has a first surface, a second surface, and a tilted surface connecting the first surface and the second surface;
a barrier layer covering the sidewall and the bottom of the through via hole;
a glue layer covering the barrier layer;
a copper seed layer covering the glue layer; and
a copper layer covering the copper seed layer and filling the through via hole.

2. The semiconductor device of claim 1, wherein the dielectric structure is an inter-metal dielectric layer.

3. The semiconductor device of claim 1, wherein the dielectric structure comprises a plurality of dielectric films stacked on each other, and materials of the dielectric films are not all the same.

4. The semiconductor device of claim 3, wherein the materials of the dielectric films are selected from a group consisting from silicon nitride, silicon carbide, silicon oxide, and combinations thereof.

5. The semiconductor device of claim 1, wherein the barrier layer comprises a tantalum nitride layer or a titanium nitride layer.

6. The semiconductor device of claim 1, wherein the glue layer comprises a cobalt layer.

7. A semiconductor device, comprising:
a substrate;
a first dielectric layer disposed over the substrate;
a dielectric structure disposed on the first dielectric layer;
a second dielectric layer disposed on the dielectric structure, wherein a through via hole passes through the second dielectric layer, the dielectric structure, and the first dielectric layer, the through via hole comprises a bottom and a sidewall adjacent to the bottom, and the sidewall of the through via hole comprises at least one indentation structure in the dielectric structure, wherein the at least one indentation structure has a substantially C-shaped cross-section, and the at least one indentation structure has a first surface, a second surface, and a tilted surface connecting the first surface and the second surface;
a barrier layer covering the sidewall and the bottom of the through via hole;
a glue layer covering the barrier layer;
a copper seed layer covering the glue layer; and
a copper layer covering the copper seed layer and filling the through via hole.

8. The semiconductor device of claim 7, wherein the dielectric structure comprises a plurality of dielectric films stacked on each other, and materials of the dielectric films are not all the same.

9. The semiconductor device of claim 8, wherein the materials of the dielectric films are selected from a group consisting from silicon nitride, silicon carbide, silicon oxide, and combinations thereof.

10. The semiconductor device of claim 7, wherein the first dielectric layer is formed from one single dielectric material.

11. The semiconductor device of claim 7, wherein the second dielectric layer is formed from one single dielectric material.

12. The semiconductor device of claim 7, wherein the barrier layer comprises a tantalum nitride layer or a titanium nitride layer.

13. The semiconductor device of claim 7, wherein the glue layer comprises a cobalt layer.

14. A semiconductor device, comprising:
a substrate;
a dielectric structure disposed over the substrate, wherein the dielectric structure comprises a first dielectric film, a second dielectric film, and a third dielectric film stacked in sequence, the dielectric structure has a through via hole passing through the dielectric structure, the through via hole comprises a bottom and a sidewall adjacent to the bottom, and the sidewall of the through via hole comprises a first indentation structure in the second dielectric film, wherein the first indentation structure has a substantially C-shaped cross-section, and the first indentation structure has a first surface, a second surface, and a tilted surface connecting the first surface and the second surface;
a barrier layer covering the sidewall and the bottom of the through via hole;
a glue layer covering the barrier layer;
a copper seed layer covering the glue layer; and
a copper layer covering the copper seed layer and filling the through via hole.

15. The semiconductor device of claim 14, wherein materials of the first dielectric film, the second dielectric film, and the third dielectric film are not all the same.

16. The semiconductor device of claim 14, wherein materials of the first dielectric film, the second dielectric film, and the third dielectric film are selected from a group consisting from silicon nitride, silicon carbide, silicon oxide, and combinations thereof.

17. The semiconductor device of claim 14, wherein the barrier layer comprises a tantalum nitride layer or a titanium nitride layer.

18. The semiconductor device of claim 14, wherein the glue layer comprises a cobalt layer.

19. The semiconductor device of claim 14, wherein the dielectric structure further comprises:
   a fourth dielectric film disposed on the third dielectric film; and
   a fifth dielectric film disposed on the fourth dielectric film, wherein the through via hole passes the fourth dielectric film and the fifth dielectric film, and the sidewall of the through via hole further comprises a second indentation in the fourth dielectric film.

20. The semiconductor device of claim 19, wherein the second indentation structure has a substantially C-shaped cross-section, and the second indentation structure has a first surface, a second surface, and a tilted surface connecting the first surface and the second surface.

* * * * *